United States Patent
Inoue et al.

(10) Patent No.: US 12,263,686 B2
(45) Date of Patent: Apr. 1, 2025

(54) ELECTRONIC APPARATUS

(71) Applicant: RISO KAGAKU CORPORATION, Tokyo (JP)

(72) Inventors: Hideaki Inoue, Ibaraki (JP); Seiichiro Nagata, Ibaraki (JP); Takahiro Abe, Ibaraki (JP)

(73) Assignee: RISO KAGAKU CORPORATION, Tokyo (JP)

( * ) Notice: Subject to any disclaimer, the term of this patent is extended or adjusted under 35 U.S.C. 154(b) by 243 days.

(21) Appl. No.: 17/858,448

(22) Filed: Jul. 6, 2022

(65) Prior Publication Data
US 2023/0096525 A1 Mar. 30, 2023

(30) Foreign Application Priority Data
Sep. 22, 2021 (JP) .................... 2021-154041

(51) Int. Cl.
*H05K 7/04* (2006.01)
*B41J 2/44* (2006.01)
*H05K 9/00* (2006.01)

(52) U.S. Cl.
CPC ............... *B41J 2/44* (2013.01); *H05K 7/04* (2013.01); *H05K 9/0049* (2013.01)

(58) Field of Classification Search
CPC ... B41J 2/44; B41J 29/13; B41J 11/007; B41J 29/02; B41J 29/38; H05K 7/04; H05K 9/0049; H05K 9/0041
See application file for complete search history.

(56) References Cited

U.S. PATENT DOCUMENTS

| | | | |
|---|---|---|---|
| 2005/0211458 A1* | 9/2005 | Sakamoto | H05K 9/0052 174/50 |
| 2017/0009502 A1* | 1/2017 | Lahulek | E06B 5/00 |
| 2018/0173912 A1* | 6/2018 | Duron | G06K 7/10425 |
| 2020/0169315 A1* | 5/2020 | Anderson | H04W 92/20 |

FOREIGN PATENT DOCUMENTS

| CN | 209474092 U | * 10/2019 |
|---|---|---|
| JP | 4609452 B2 | 1/2011 |

* cited by examiner

*Primary Examiner* — Rockshana D Chowdhury
*Assistant Examiner* — Keon Kim
(74) *Attorney, Agent, or Firm* — Greenblum & Bernstein, P.L.C.

(57) ABSTRACT

An electronic apparatus includes: a chassis formed of a conductive member and including an opening; a radiation source arranged in the chassis and radiating noise electric waves; and a conductor formed of a conductive member and arranged on a same side of the radiation source as the opening with at least a part of the conductor overlapping the opening in a plan view of the opening. The conductor has one end electrically connected to the chassis and the other end as an electrically open end.

10 Claims, 4 Drawing Sheets

ELECTRONIC APPARATUS

CROSS REFERENCE TO RELATED APPLICATION

This application is based upon and claims the benefit of priority from the prior Japanese Patent Application No. 2021-154041 filed on Sep. 22, 2021, the entire contents of which are incorporated herein by reference.

BACKGROUND

1. Technical Field

The disclosure relates to an electronic apparatus.

2. Related Art

In an electronic apparatus such as the printing apparatus described in Japanese Patent No. 4609452, noise electric waves (spurious emissions) may be radiated from built-in components and the like. Leakage of these noise electric waves to the outside may cause failures in other electronic apparatuses.

Leakage of noise electric waves can be suppressed with a structure in which a chassis of the electronic apparatus is made from metal without an opening. However, a relatively large opening may be provided in a chassis for allowing maintenance of the inside of an electronic apparatus to be easily performed, for example. In this electronic apparatus, noise electric waves may be leaked from the opening in the chassis.

Leakage of noise electric waves to the outside can be reduced with a structure in which an opening is shielded with a conductive member made of metal or the like.

SUMMARY

Employment of the above structure in which the opening is shielded with a conductive member leads to an increase in the weight and the cost of the electronic apparatus.

The disclosure is directed to an electronic apparatus which is capable of reducing noise electric waves leaking outside a chassis without employing a structure in which an opening in the chassis is shielded with a conductive member.

An electronic apparatus in accordance with some embodiments includes: a chassis formed of a conductive member and including an opening; a radiation source arranged in the chassis and radiating noise electric waves; and a conductor formed of a conductive member and arranged on a same side of the radiation source as the opening with at least a part of the conductor overlapping the opening in a plan view of the opening. The conductor has one end electrically connected to the chassis and the other end as an electrically open end.

According to the aforementioned configuration, it is possible to reduce noise electric waves leaking outside the chassis without employing a structure in which the opening in the chassis is shielded with a conductive member.

DETAILED DESCRIPTION

Figure 1:
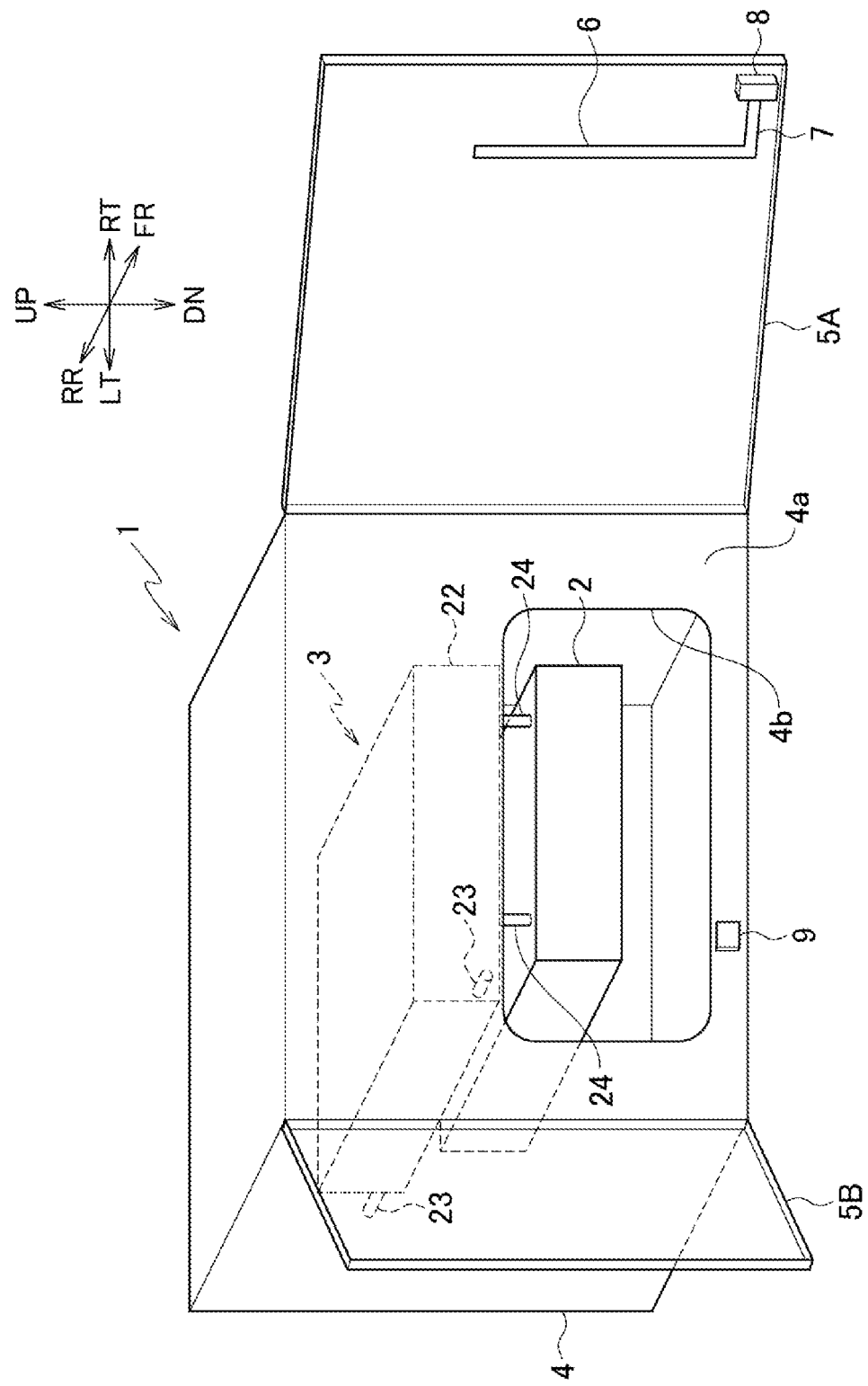
FIG. 1 is a perspective view illustrating a schematic configuration of a printing apparatus according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Description will be hereinbelow provided for embodiments of the present invention by referring to the drawings. It should be noted that the same or similar parts and components throughout the drawings will be denoted by the same or similar reference signs, and that descriptions for such parts and components will be omitted or simplified.

In addition, it should be noted that the drawings are schematic and therefore different from that in reality.

Figure 2:
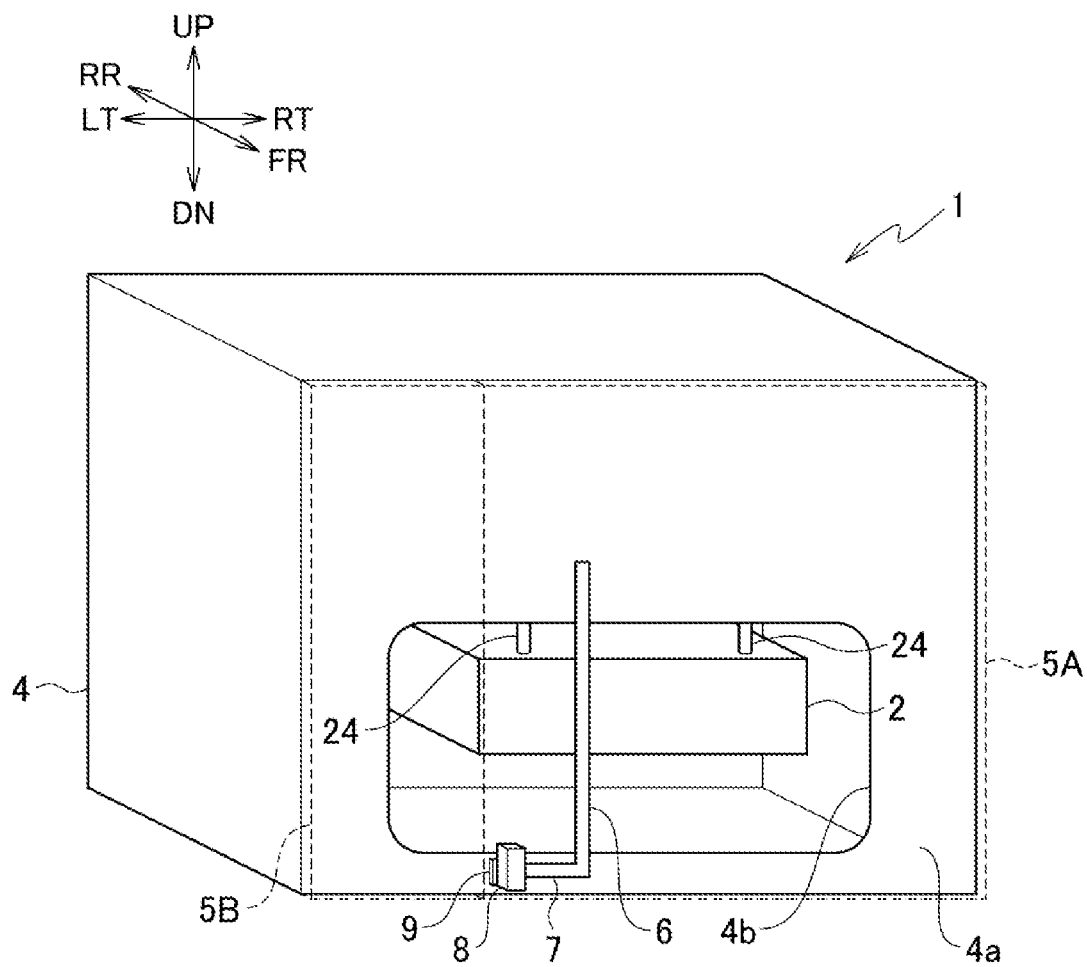
FIG. 2 is a perspective view of the printing apparatus of FIG. 1 with its covers closed.
Figure 3:
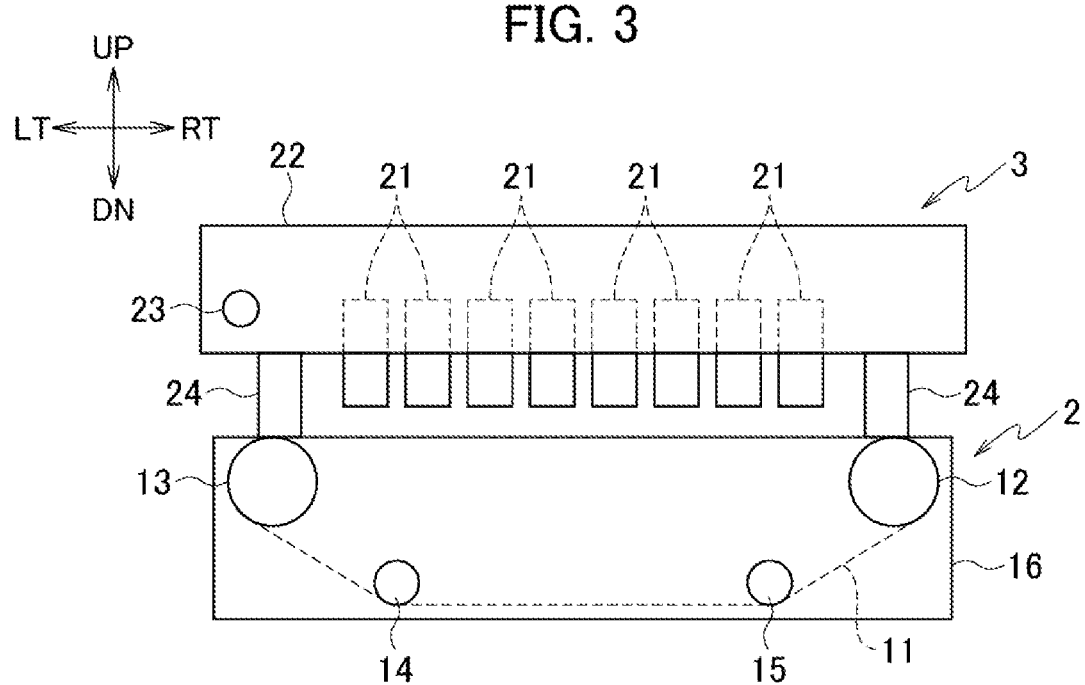
FIG. 3 is a view illustrating schematic configurations of a printer and a conveyor of the printing apparatus of FIG. 1.
Figure 4:
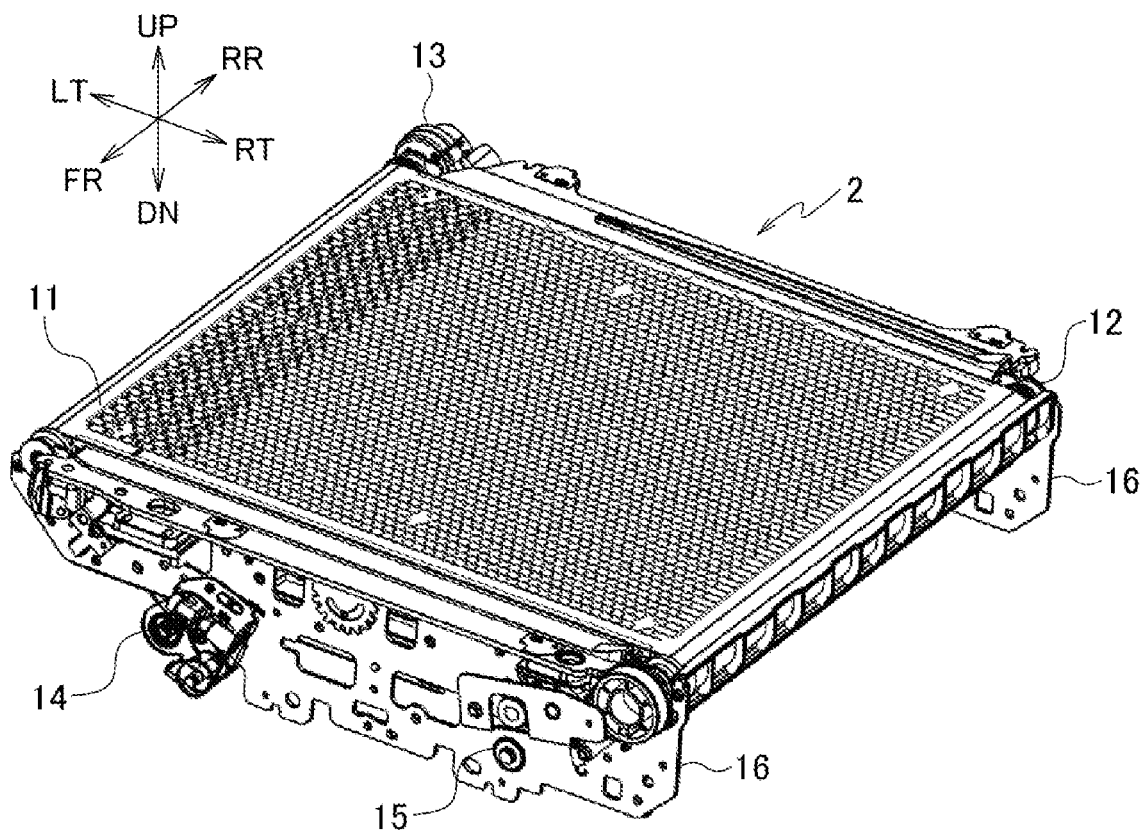
FIG. 4 is a perspective view of the conveyor of the printing apparatus of FIG. 1.

FIG. 1 is a perspective view illustrating a schematic configuration of a printing apparatus 1 according to an embodiment of the present invention. FIG. 2 is a perspective view of the printing apparatus 1 of FIG. 1 with its covers 5A, 5B closed. FIG. 3 is a view illustrating schematic configurations of a printer 3 and a conveyor 2 of the printing apparatus 1 of FIG. 1. FIG. 4 is a perspective view of the conveyor 2 of the printing apparatus 1 of FIG. 1. In the following description, right and left in the page space of FIG. 1 is referred to as the right-left direction, up and down is referred to as the up-down direction, and front and rear is referred to as the front-rear direction. In FIGS. 1 to 4, the directions of right, left, up, down, front, and rear are denoted by RT, LT, UP, DN, FR, and RR, respectively. In FIG. 2, the covers 5A, 5B are illustrated with dashed lines.

As illustrated in FIGS. 1 and 2, the printing apparatus (electronic apparatus) 1 includes a conveyor (radiation source) 2, a printer 3, a chassis 4, covers (doors) 5A, 5B, a conductor 6, a connector 7, a magnet catch 8, and an attraction sheet metal 9.

The conveyor 2 conveys a sheet (not illustrated) fed from a sheet feeder (not illustrated). The conveyor 2 is arranged in the chassis 4. The conveyor 2 is capable of being lifted and lowered by a lifting/lowering mechanism (not illustrated). As illustrated in FIGS. 3 and 4, the conveyor 2 includes a conveyance belt 11, a drive roller 12, driven rollers 13 to 15, and side plates 16.

The conveyance belt 11 conveys a sheet while sucking and holding the sheet thereon. The conveyance belt 11 is a loop belt bridged between the drive roller 12 and the driven rollers 13 to 15. The conveyance belt 11 has a number of belt holes. The conveyance belt 11 sucks and holds a sheet thereon by suction force generated at the belt holes due to the driving of a fan (not illustrated).

The drive roller 12 rotates the conveyance belt 11.

The drive roller 12 is driven to rotate by a motor (not illustrated). The driven rollers 13 to 15 support the conveyance belt 11 together with the drive roller 12. The driven rollers 13 to 15 rotate to follow the conveyance belt 11.

The side plates 16 rotatably hold the drive roller 12 and the driven rollers 13 to 15. Two side plates 16 are provided in the conveyor 2. One of the side plates 16 holds the drive roller 12 and the driven rollers 13 to 15 at the front side end and the other of the side plates 16 holds the drive roller 12 and the driven rollers 13 to 15 at the rear side end. Each of the side plates 16 is formed of a conductive member made of metal or the like.

The printer 3 performs printing on a sheet conveyed by the conveyor 2. The printer 3 is arranged above the conveyor 2 in the chassis 4. As illustrated in FIGS. 1 and 3, the printer 3 includes inkjet heads 21, a head holder 22, a head holder connector 23, and connection pins 24.

The inkjet heads 21 include nozzles (not illustrated) which open at the bottom surfaces thereof facing the conveyor 2. The inkjet heads 21 eject ink from the nozzles and form an image on a sheet. Piezo elements (not illustrated) which allow ink to be ejected from each nozzle and a head drive integrated circuit (not illustrated) which drives the piezo elements are arranged in each of the inkjet heads 21.

The head holder 22 holds the inkjet heads 21. The head holder 22 has an approximate hollow cuboid shape. The head holder 22 is formed of a conductive member made of metal or the like. A drive circuit (not illustrated) which controls the driving of each inkjet head 21 is arranged in the head holder 22.

The head holder connector 23 connects the head holder 22 to the chassis 4.

The connection pins 24 are members used for positioning the head holder 22 and the conveyor 2. The connection pins 24 are provided to protrude from two locations at the right and left of the front portion of the head holder 22. The conveyor 2 is positioned by connecting the conveyor 2 with the head holder 22 through insertion of the connection pins 24 into connection holes in the conveyor 2 which is capable of being lifted and lowered. The positions of the connection pins 24 are adjustable in the front-rear direction. Each of the connection pins 24 is formed of a conductive member made of metal or the like. The head holder 22 and the side plates 16 of the conveyor 2 are electrically connected to each other in the state where the head holder 22 and the conveyor 2 are connected to each other by the connection pins 24.

The chassis 4 houses the conveyor 2 and the printer 3 therein. The chassis 4 has an approximate hollow cuboid shape. The chassis 4 is formed of a conductive member made of metal or the like. The chassis 4 is grounded. The chassis 4 has an opening 4b which opens a part of a front surface sheet metal 4a defining a front surface of the chassis 4.

The opening 4b allows a user to access the conveyor 2 or the like in the chassis 4 when the user performs maintenance or the like. The opening 4b has a size sufficient for the user to access the conveyor 2 or the like. The opening 4b is formed such that at least part of the conveyor 2 can be within an opening area of the opening 4b in a plan view (i.e. plan view of the opening 4b). In the present embodiment, the opening 4b is formed such that the entirety of the conveyor 2 can be within the opening area of the opening 4b in a plan view (i.e. plan view of the opening 4b).

The covers 5A, 5B cover the front surface (the front surface sheet metal 4a) of the chassis 4. The cover 5A covers the right side of the front surface of the chassis 4 and the cover 5B covers the left side of the front surface of the chassis 4. The covers 5A, 5B are doors capable of opening and closing. That is, the covers 5A, 5B are doors which open and close the opening 4b in the chassis 4. The covers 5A, 5B are formed of insulation members made of resin or the like.

As described later, the conductor 6 forms a return path for suppressing leakage of noise electric waves (spurious emissions) radiated from the side plates 16 of the conveyor 2 to the outside of the printing apparatus 1. The conductor 6 is formed of a conductive member. For example, the conductor 6 is a conductive tape attached on the cover 5A. The conductor 6 is arranged at the opening 4b side of the conveyor 2 such that at least a part of the conductor 6 overlaps the opening 4b in a plan view (i.e. plan view of the opening 4b) in the state where the cover 5A is closed.

In the present embodiment, the conductor 6 is arranged adjacent to the opening 4b at the outer side of the chassis 4 in the state where the cover 5A is closed.

The conductor 6 has a shape elongated in the polarized wave direction of the noise electric waves radiated from the side plates 16 of the conveyor 2. In the present embodiment, the polarized wave direction of the noise electric waves radiated from the side plates 16 of the conveyor 2 is the vertical direction. Thus, the conductor 6 has a shape elongated in the vertical direction (up-down direction).

One end (lower end) of the conductor 6 is electrically connected to the chassis 4 via the connector 7, the magnet catch 8, and the attraction sheet metal 9, and the other end (upper end) of the conductor 6 is an electrically open end in the state where the cover 5A is closed. With this structure, the conductor 6 forms an antenna structure together with the conveyor 2 and functions as a return path for the noise electric waves. The length of the conductor 6 in the polarized wave direction (up-down direction) of the noise electric waves is set to a length corresponding to the wavelength (frequency) of the noise electric waves so as to receive the noise electric waves with high efficiency. The more the wavelength of the noise electric waves increases, the longer the length of the conductor 6 becomes in the polarized wave direction of the noise electric waves. The length of the conductor 6 in the polarized wave direction of the noise electric waves is experimentally determined, for example.

In the present embodiment, the conductor 6 is arranged at a position where the noise electric waves are strongest in the right-left direction in the state where the cover 5A is closed. The position of the conductor 6 in the right-left direction in the state where the cover 5A is closed is experimentally determined, for example. The distance between the conductor 6 and the side plates 16 of the conveyor 2 in the front-rear direction in the state where the cover 5A is closed is equal to or less than a prescribed distance with which the conductor 6 can function as a return path for the noise electric waves.

The connector 7 electrically connects the conductor 6 with the magnet catch 8. The connector 7 is formed of a conductive member. For example, the connector 7 is a conductive tape attached on the cover 5A. The connector 7 may be formed integrally with the conductor 6.

The magnet catch 8 is a member which is magnetically attracted to the attraction sheet metal 9 to keep the cover 5A closed. The magnet catch 8 electrically connects the connector 7 with the attraction sheet metal 9 in the state where the cover 5A is closed. The magnet catch 8 has a portion formed of a conductive member made of metal or the like and this portion electrically connects the connector 7 with the attraction sheet metal 9 in the state where the cover 5A is closed. The magnet catch 8 is arranged at the inner lower portion of the cover 5A.

The attraction sheet metal 9 is a member to which the magnet catch 8 is magnetically attracted when the cover 5A is closed. The attraction sheet metal 9 is formed of a conductive member made of metal or the like. The attraction sheet metal 9 is installed on the front surface sheet metal 4a of the chassis 4 and is electrically connected to the chassis 4.

Next, operations of the printing apparatus 1 will be described.

When printing is performed in the printing apparatus 1, a sheet is fed from a sheet feeder to the conveyor 2 and the conveyor 2 conveys the fed sheet. Then, the inkjet heads 21 of the printer 3 eject ink and form an image on the sheet conveyed by the conveyor 2. The printing operation is performed in the state where the covers 5A, 5B are closed.

Upon the drive circuit described above driving the inkjet heads 21 to eject ink in the printing operation, a high-frequency electric current I with a frequency related to the ejection drive is transmitted to the side plates 16 of the conveyor 2 via the head holder 22 and the connection pins 24. Thus, the conveyor 2 (the side plates 16) becomes a radiation source of the noise electric waves.

Figure 5:
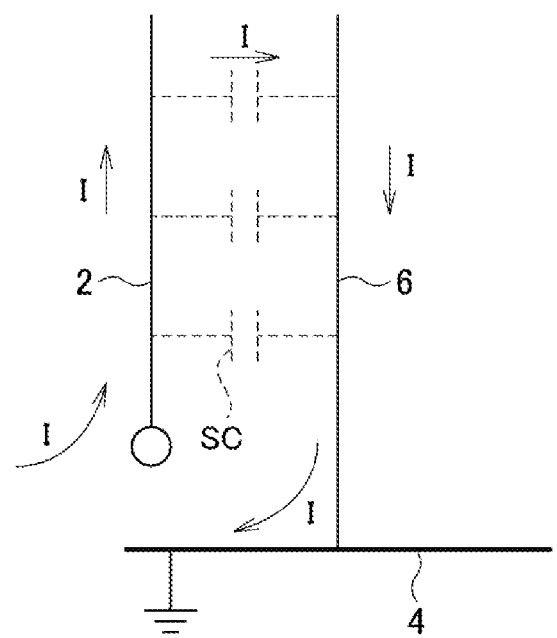
FIG. 5 is an explanatory view (image view) of an antenna structure formed by the conveyor and a conductor of the printing apparatus of FIG. 1.

In the state where the covers 5A, 5B are closed, an antenna structure is formed by the conveyor 2 and the conductor 6. An explanatory view of the antenna structure is illustrated in FIG. 5. In the antenna structure in FIG. 5, the conveyor 2 (the side plates 16) forms a positive electrode and the conductor 6 forms a negative electrode. The conductor 6 is electrically connected to the chassis 4 which is grounded.

During the printing operation, as illustrated in FIG. 5, the high-frequency electric current I described above flows in the conveyor 2. The high-frequency electric current I flows from the side plates 16 of the conveyor 2 to the conductor 6 via a spatial capacity SC. Thus, the noise electric waves are radiated from the side plates 16 of the conveyor 2 and then the radiated noise electric waves are received at the conductor 6. In this way, the conductor 6 functions as a return path for the noise electric waves and leakage of the noise electric waves to the outside of the printing apparatus 1 is reduced.

In the case where the conductor 6 is not provided unlike the present embodiment, since there is no return path for the noise electric waves, leakage of the noise electric waves to the outside of the printing apparatus 1 cannot be suppressed and failures in nearby electronic apparatuses may be caused.

As explained above, the printing apparatus 1 includes the conductor 6. Since the conductor 6 functions as a return path for the noise electric waves radiated from the conveyor 2 (the side plates 16), leakage of the noise electric waves to the outside of the printing apparatus 1 is reduced. Provision of the conductor 6 reduces leakage of the noise electric waves to the outside of the printing apparatus 1 without the structure in which the opening 4b is shielded by the covers 5A, 5B formed of conductive members made of metal or the like.

Accordingly, the printing apparatus 1 can reduce noise electric waves leaking outside the chassis 4 without employing a structure in which the opening 4b of the chassis 4 is shielded with a conductive member.

In the printing apparatus 1, the conductor 6 has a shape elongated in the polarized wave direction of the noise electric waves radiated from the side plates 16 of the conveyor 2. Thus, a return path for the noise electric waves can be realized by the conductor 6 which is compact.

In the printing apparatus 1, the length of the conductor 6 in the polarized wave direction of the noise electric waves is set to a length corresponding to the wavelength of the noise electric waves. Thus, the conductor 6 can receive the noise electric waves with high efficiency and reduce more leakage of the noise electric waves to the outside of the printing apparatus 1.

In the printing apparatus 1, the conductor 6 is installed on the cover 5A, and one end of the conductor 6 is electrically connected to the chassis 4 in the state where the cover 5A is closed. Thus, the return path for the noise electric waves implemented by the conductor 6 can be realized by utilizing the existing cover 5A.

In the printing apparatus 1, the covers 5A, 5B are formed of insulation members made of resin or the like. Thus, the conductor 6 can be supported at a prescribed location of the covers 5A, 5B without affecting the return path for the noise electric waves formed by the conductor 6. The weight of the printing apparatus 1 can be also reduced.

In the embodiment above, the opening 4b is an opening which opens a part of the front surface (the front surface sheet metal 4a) of the chassis 4. However, the opening 4b may be an opening which opens one whole surface of the chassis 4.

In the embodiment above, the conductor 6 has a shape elongated in the polarized wave direction of the noise electric waves. However, the shape of the conductor 6 is not limited thereto and the conductor 6 may have a planar shape which is rectangular and wider such as a square shape.

In the embodiment above, the conductor 6 is a conductive tape attached on the cover 5A. However, the conductor 6 may be a conductive member other than a conductive tape. The conductor 6 may be provided such that the conductor 6 is separate from the cover 5A and one end of the conductor 6 is electrically connected to the chassis 4. The conductor 6 may be arranged inside the chassis 4 at the opening 4b side of the conveyor 2.

In the embodiment above, one end of the conductor 6 is electrically connected indirectly to the chassis 4 via the magnet catch 8 and the like. However, the one end of the conductor 6 may be electrically connected directly to the chassis 4.

In the embodiment above, the covers 5A, 5B are formed of insulation members made of resin or the like. However, the configuration where a cover is formed of a conductive member made of metal or the like but cannot shield the opening 4b is also applicable to the present invention.

In the embodiment above, the two covers 5A, 5B cover the front surface (the front surface sheet metal 4a) of the chassis 4. However, the present invention is not limited thereto and there may be one cover or three or more covers. The conductor 6 may be arranged at the opening 4b side of the conveyor 2 with no cover.

In the embodiment above, the conductor 6 is arranged at a position where the noise electric waves are strongest in the right-left direction in the state where the cover 5A is closed. However, the position of the conductor 6 is not limited thereto and the position of the conductor 6 in the right-left direction may be within a prescribed range which includes the position where the noise electric waves are strongest in the right-left direction, for example. The conductor 6 may be arranged near the conveyor (radiation source) 2 in accordance with the position of the conveyor (radiation source) 2 such that at least a part of the conductor 6 overlaps the opening 4b in a plan view (i.e. plan view of the opening 4b).

The embodiment above takes a printing apparatus as an example. However, the present invention is not limited thereto and the present invention is applicable to an electronic apparatus wherein a radiation source of noise electric waves is arranged in a chassis with an opening. Embodiments of the disclosure include, for example, the following configurations.

An electronic apparatus includes: a chassis formed of a conductive member and including an opening; a radiation source arranged in the chassis and radiating noise electric waves; and a conductor formed of a conductive member and arranged on a same side of the radiation source as the opening with at least a part of the conductor overlapping the opening in a plan view of the opening. The conductor has one end electrically connected to the chassis and the other end as an electrically open end.

The conductor may have a shape elongated in a polarized wave direction of the noise electric waves.

The conductor may have a length corresponding to a wavelength of the noise electric waves in a polarized wave direction of the noise electric waves.

The electronic apparatus above may further include a door capable of opening and closing the opening. The conductor may be installed on the door, and the one end of the conductor may be electrically connected to the chassis with the door being closed.

Embodiments of the present invention have been described above. However, the invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

Moreover, the effects described in the embodiments of the present invention are only a list of optimum effects achieved by the present invention. Hence, the effects of the present invention are not limited to those described in the embodiment of the present invention.

What is claimed is:

1. An electronic apparatus comprising:
   a chassis formed of a conductive member and including an opening;
   a radiation source arranged in the chassis and radiating noise electric waves;
   a conductor formed of a conductive member and arranged on a same side of the radiation source as the opening with at least a part of the conductor overlapping the opening in a plan view of the opening, the conductor having one end electrically connected to the chassis and the other end as an electrically open end; and
   a door capable of opening and closing the opening,
   wherein the conductor is affixed to an external surface of the door that is interior-facing with the door being closed, and the one end of the conductor is electrically connected to the chassis with the door being closed, and the conductor overlaps only a part of the opening in the plan view with the door being closed.

2. The electronic apparatus according to claim 1, wherein the conductor has a shape elongated in a polarized wave direction of the noise electric waves.

3. The electronic apparatus according to claim 1, wherein the conductor has a length corresponding to a wavelength of the noise electric waves in a polarized wave direction of the noise electric waves.

4. The electronic apparatus according to claim 1, wherein the door is formed of an insulation member.

5. The electronic apparatus according to claim 1, wherein the conductor is a conductive tape attached on the door.

6. The electronic apparatus according to claim 1, wherein the conductor is arranged adjacent to the opening at an outer side of the chassis with the door being closed.

7. The electronic apparatus according to claim 1, wherein the one end of the conductor is electrically connected to the chassis via a connector, a magnet catch, and an attraction sheet metal with the door being closed.

8. The electronic apparatus according to claim 7, wherein the connector is a conductive tape attached on the door and configured to electrically connect the conductor with the magnet catch.

9. The electronic apparatus according to claim 7, wherein the magnet catch:
   is a member magnetically attracted to the attraction sheet metal to keep the door closed;
   is configured to electrically connect the connector with the attraction sheet metal with the door being closed; and
   has a portion formed of a conductive member and configured to electrically connect the connector with the attraction sheet metal with the door being closed.

10. The electronic apparatus according to claim 7, wherein the attraction sheet metal is:
   a member to which the magnet catch is magnetically attracted when the door is closed;
   formed of a conductive member; and
   installed on a front surface sheet metal of the chassis and electrically connected to the chassis.

* * * * *

UNITED STATES PATENT AND TRADEMARK OFFICE
CERTIFICATE OF CORRECTION

PATENT NO. : 12,263,686 B2  
APPLICATION NO. : 17/858448  
DATED : April 1, 2025  
INVENTOR(S) : H. Inoue et al.

Page 1 of 1

It is certified that error appears in the above-identified patent and that said Letters Patent is hereby corrected as shown below:

In the Claims

Column 8, Line 4 (Claim 1, Line 15) please change "closed, and the" to -- closed, the --

Signed and Sealed this  
Twenty-sixth Day of August, 2025

Coke Morgan Stewart  
*Acting Director of the United States Patent and Trademark Office*